(12) United States Patent
Lee et al.

(10) Patent No.: US 9,884,970 B2
(45) Date of Patent: Feb. 6, 2018

(54) COATING COMPOSITION FOR PREVENTING COLLAPSE OF CAPACITOR

(71) Applicant: YOUNG CHANG CHEMICAL CO., LTD., Gyeongsangbuk-do (KR)

(72) Inventors: Su Jin Lee, Daegu (KR); Gi Hong Kim, Daegu (KR); Seung Hun Lee, Daegu (KR)

(73) Assignee: YOUNG CHANG CHEMICAL CO., LTD, Seongju-gun (KR)

( * ) Notice: Subject to any disclaimer, the term of this patent is extended or adjusted under 35 U.S.C. 154(b) by 32 days.

(21) Appl. No.: 14/440,414

(22) PCT Filed: Dec. 10, 2013

(86) PCT No.: PCT/KR2013/011389
§ 371 (c)(1),
(2) Date: May 4, 2015

(87) PCT Pub. No.: WO2014/092424
PCT Pub. Date: Jun. 19, 2014

(65) Prior Publication Data
US 2015/0274991 A1    Oct. 1, 2015

(30) Foreign Application Priority Data
Dec. 12, 2012  (KR) .................. 10-2012-0144338

(51) Int. Cl.
| | | |
|---|---|---|
| *H01L 49/02* | (2006.01) |
| *C09D 7/00* | (2006.01) |
| *C09D 7/12* | (2006.01) |
| *C09D 183/04* | (2006.01) |
| *H01L 27/108* | (2006.01) |
| *C08K 5/521* | (2006.01) |

(52) U.S. Cl.
CPC ........... *C09D 7/1233* (2013.01); *C09D 7/001* (2013.01); *C09D 183/04* (2013.01); *H01L 28/40* (2013.01); *C08K 5/521* (2013.01); *H01L 27/10852* (2013.01); *H01L 28/91* (2013.01)

(58) Field of Classification Search
None
See application file for complete search history.

(56) References Cited

U.S. PATENT DOCUMENTS

2008/0083920 A1* 4/2008 Lee .................. H01L 28/91
257/40
2009/0311874 A1* 12/2009 Tomita .............. H01L 21/02057
438/759

FOREIGN PATENT DOCUMENTS

| KR | 10-0787351 B1 | 12/2007 |
| KR | 10-2009-0130828 A | 12/2009 |
| KR | 10-2012-121919 A | 11/2012 |
| WO | 2012/090779 A1 | 7/2012 |

OTHER PUBLICATIONS

English language machine translation of KR10-2012-121919, Nov. 6, 2012, Saito et al.*
International Searching Authority, International Search Report for PCT/KR2013/011389 dated Mar. 20, 2014 [PCT/ISA/210].
Japanese Patent Office; Communication dated Apr. 4, 2017 in counterpart application No. 2015-541700.

* cited by examiner

*Primary Examiner* — Angel Roman
(74) *Attorney, Agent, or Firm* — Sughrue Mion, PLLC

(57) ABSTRACT

Disclosed herein is a coating composition for preventing the collapse of a capacitor, comprising a silane compound or a phosphorus compound. The coating composition can adjust a contact angle with regard to water on a substrate, thereby preventing the collapse of capacitor patterns on the substrate.

3 Claims, No Drawings

COATING COMPOSITION FOR PREVENTING COLLAPSE OF CAPACITOR

CROSS REFERENCE TO RELATED APPLICATIONS

This application is a National Stage of International Application No. PCT/KR2013/011389, filed on Dec. 10, 2013, which claims priority from Korean Patent Application No. 10-2012-0144338, filed on Dec. 12, 2012, the contents of all of which are incorporated herein by reference in their entirety.

TECHNICAL FIELD

The present invention relates to a coating composition for preventing the collapse of a capacitor.

BACKGROUND ART

With the rapid and wide dissemination of information media, such as portable electronic equipment and personal computers, semiconductor devices have been required to have larger capacities, faster processing speeds, and smaller sizes. To meet these requirements, there is an urgent need for facilities or technologies with or by which high-density semiconductors that are improved in degree of integration, reliability, and data accessibility can be fabricated.

A capacitor, which is one of semiconductor device elements, is structured to have a storage node for a lower electrode, and a plate node for an upper electrode, with a dielectric film intercalated therebetween. For a high degree of integration of semiconductor devices, a high-capacitance capacitor that guarantees sufficient electrostatic capacity is needed.

In a capacitor, the capacitance is directly proportional to both the surface area of the electrodes and the dielectric constant of the dielectric film and inversely proportional to the thickness of the dielectric film. Accordingly, various methods for ensuring sufficient capacitance have been directed towards the development of a dielectric membrane with a large dielectric constant, the reduction of the thickness of a dielectric film, the enlargement of the surface area of capacitor storage electrodes, and the reduction of the distance between electrodes, etc.

For example, capacitors with a 3-dimensional structure, such as concave-type or cylinder-type capacitors, were developed to enlarge the surface area of storage electrodes. In recent years, rather than a concave-type capacitor that utilizes only the internal area as the node area, a cylinder-type capacitor that utilizes the external area as well as the internal area as the node area has been practically applied in the mass-production of semiconductor devices.

Typically, the fabrication of a 3D cylinder-type capacitor starts with the formation of a capacitor pattern, followed by dry etching the capacitor oxide film to form a trench within which a storage electrode is constructed. Then, the capacitor oxide film is removed by a wet-dip process using a wet chemical including HF or $NH_4F$.

In the past, no problems were found in this wet etching process when the aspect ratio of the capacitor was low. However, as aspect ratios have increased, the capacitor is apt to collapse when finally washed with distilled water alone.

The force of causing the collapse of the patterns formed on the substrate is in proportion to the surface tension of the liquid used in the pattern formation and washing process and the cosine value of the contact angle of the liquid on against the patterns. Hence, the reduction of the liquid surface tension has arisen as an issue and a solution to the problem of collapse is being actively researched. In practice, the following methods are employed.

To prevent the patterns from collapsing, the manufacturers either use an alcohol such as isopropanol or a surfactant to reduce the surface tension on the patterns, or increase the supporting force of the patterns per se by connecting the patterns to a support such as bridge or by tying the patters in a bundle.

Recently, the fabrication of semiconductor devices is being achieved by finer lithographic technologies, resulting in a rapid increase in the aspect ratio of capacitors by 50% or greater, compared to conventional processes. Thus, the collapse of capacitors cannot be prevented by the method mentioned above, or the production cost of the support is sharply increased. There is therefore a need for a method by which the collapse of capacitors can be solved at low production cost.

As mentioned above, the factors that influence the force causing collapse of capacitor patterns include the surface tension ($\Gamma$) of washing liquid, the aspect ratio according to the height (H) of storage electrodes, the distance (D) between storage electrodes, the width (W) of storage electrodes, and the contact angle ($\theta$) of washing liquid with regard to storage electrodes.

In a capacitor fabrication process, the wetting step is finished by spin drying the wafer. In this regard, it is important that a washing agent with low surface tension is used to reduce the force when it is evacuated by spin drying. However, currently developed capacitors are too high in aspect ratio to resist the collapse of patterns with a washing agent whose surface tension is only reduced to some degree. At present, there are no existing materials with a surface tension that approximates 0 $J/m^2$, except for liquid helium, and among commercially available surfactants and materials, the lowest surface tension measured is 15 $J/m^2$. A variety of experiments have demonstrated that a washing liquid having such surface tension cannot avoid collapsing capacitors.

In other words, at the present time, the control of the surface tension is not an effective method for preventing the collapse of capacitors.

DISCLOSURE

Technical Problem

The present invention aims to provide a coating composition for preventing the collapse of a capacitor that has a contact angle of near 90° with regard to water.

Also, the present invention aims to provide a capacitor coated with a coating composition that has a contact angle of near 90° with regard to water to prevent the capacitor from collapsing.

Technical Solution

In accordance with an aspect thereof, the present invention provides a coating composition for preventing the collapse of a capacitor, comprising at least one selected from the group consisting of a silane compound represented by the following Chemical Formula 1, a phosphorus compound represented by the following Chemical Formula 2, and a phosphorus compound represented by the following Chemical Formula 3:

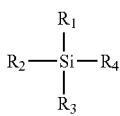

Chemical Formula 1 wherein R1, R2, R3, and R4 are each independently a hydrophilic group identified as an alkoxy group of C1~C4, or a hydrophobic group identified as an aromatic alkyl group of C2~C18, with a proviso that at least one of R1, R2, R3, and R4 is an alkoxy of C1~C4, and that at least one of R1, R2, R3, and R4 is an aromatic alkyl group of C7~C18;

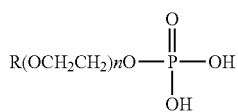

Chemical Formula 2 wherein, R is an aryl group of C6~C20 or an alkyl group of C1~C20, and n is an integer of 1 to 9; and

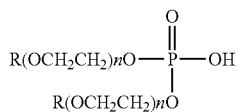

Chemical Formula 3 wherein, R is an aryl group of C6~C20 or an alkyl group of C1~C20, and n is an integer of 1 to 9.

In one embodiment, the coating composition for preventing the collapse of a capacitor may comprise the capacitor coating material in an amount of 1 to 50% by weight; and an organic solvent in an amount of 50 to 99% by weight.

In another embodiment, the organic solvent is selected from among glycol, alkylene glycol ether of C4~C20, alkylene glycol alkyl ether of C4~C20, an alcohol of C1~C10, a hydrocarbon of C6~C10, and a combination thereof.

In accordance with another aspect thereof, the present invention provides a capacitor coated with the coating composition.

In one embodiment, the capacitor has a contact angle of 80~140° with regard to water.

Advantageous Effects

As described above, the coating composition according to the present invention can be uniformly applied to capacitors over a substrate in a single wetting manner, and can prevent the capacitors from collapsing upon spin drying after cleansing with water. Hence, the coating composition reduces fabrication steps of semiconductor devices, increasing productivity as well as reducing the production cost and labor.

BEST MODE

Below, a detailed description will be given of the present invention.

The present invention addresses a coating composition for preventing the collapse of a capacitor, comprising at least one selected from the group consisting of a silane compound represented by the following Chemical Formula 1, a phosphorus compound represented by the following Chemical Formula 2, and a phosphorus compound represented by the following Chemical Formula 3:

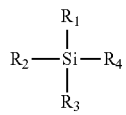

Chemical Formula 1 wherein R1, R2, R3, and R4 are each independently a hydrophilic group identified as an alkoxy group of C1~C4, or a hydrophobic group identified as an aromatic alkyl group of C2~C18, with a proviso that at least one of R1, R2, R3, and R4 is an alkoxy of C1~C4, and that at least one of R1, R2, R3, and R4 is an aromatic alkyl group of C7~C18;

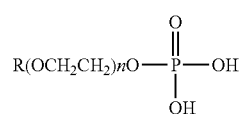

Chemical Formula 2 wherein, R is an aryl group of C6~C20, or an alkyl group of C1~C20, and n is an integer of 1 to 9; and

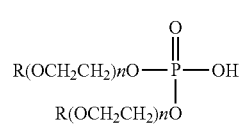

Chemical Formula 3 wherein, R is an aryl group of C6~C20 or an alkyl group of C1~C20, and n is an integer of 1 to 9.

Based on the theory that when the contact angle, which is one of the elements constituting the force applied to a capacitor, particularly, capacitor patterns, is 90°, the force disappears because the cosine value is zero. Thus, the present invention is directed to a pattern-treating material that is designed to coat capacitor patterns so as to make a contact angle of approximately 90° with regard to the water used in the final process. More particularly, the present invention concerns a coating composition for preventing the collapse of a capacitor.

After being uniformly coated with the coating composition in advance of a final washing process, a capacitor, for example, a cylinder-type capacitor can be effectively prevented from collapsing by minimizing the force applied to the capacitor patterns when the washing liquid, for example, water is evacuated.

When applied to a capacitor, the coating composition for preventing the collapse of a capacitor in accordance with the present invention is capable of making a contact angle of approximately 90° with regard to water, smoothly passing through fine spaces between capacitor patterns, being uniformly distributed across the 300 mm-wafer, being highly miscible with a solvent such as water or alcohol, maintaining a bonding force to the capacitor, being applied in a spinning manner, and being completely removed by a dry-type method using, for example, UV light or plasma after drying.

In full consideration of the above requirements, the coating composition according to the present invention may comprise a coating material that can cling well to a capacitor and form a contact angle of near 90° with regard to water, and a solvent that dissolves or dilutes the coating material.

Generally, a capacitor is made of titanium nitride (TiN), which is hydrophilic. To increase a contact angle with regard to water thereon, the capacitor should be altered to be hydrophobic. Like a coupling agent or a surfactant, the capacitor coating material of the present invention may contain both a hydrophobic moiety such as a hydroxyl group, which functions to attach to the hydrophilic inorganic surface, and a hydrophobic moiety such as alkyl or carbon fluoride, which is responsible for increasing the contact angle with regard to water.

In one embodiment of the present invention, the capacitor coating material may comprise at least one selected from the group consisting of a silane compound represented by Chemical Formula 1, a phosphorus compound represented by Chemical Formula 2, and a phosphorus compound represented by Chemical Formula 3.

Examples of the silane compound include octadecyltrimethoxysilane (OTMS), octadecyltriethoxysilane (OTES), pentyltriethoxysilane (PES), triethoxyphenylsilane (TPS), 3-aminopropyltrimethoxysilane (3-APTMS), 3-aminopropyldiethoxymethylsilane (3-APDEMS), vinyltrimethoxysilane (VTMS), trimethoxy[(phenylamino)propyl]silane (TE-PAPS), 3-(trimethoxysilyl)propyl acrylate (3TMSPA), trimethoxy(propyl)silane (TMProS), triethylsilanol (TES), (3-mercaptopropyl)trimethoxysilane (3-MCTMS), 3-chloropropyldimethoxymethylsilane (3-CPDMMS), 3-(2-aminoethylamino) (32AEAPDMMS), propyldimethoxymethylsilane, triethoxyvinylsilane (TEVS), 3-(triethoxysilyl) propyl isocyanate (3-TESPI), triethoxysilane (TEHS), triethoxymethylsilane (TEHMS), triethoxyethylsilane (TEHES), trimethoxy (p-tolyl)silane (TMPTS), triethoxy ethylsilane (TEES), triethoxy methylsilane (TEMS), triethoxy phenylsilane (TEPS), n-octyltrimethoxysilane (nOTMS), n-octyltriethoxysilane (nOTES), triethoxy-1H, 1H, 2H, 2H-tridecafluoro-n-octylsilane (TTFOS), 3-(2-aminoethylamino)propyltrimethoxysilane (APTMS), trimethoxyphenylsilane (IMPS), (3-mercaptopropyl)triethoxysilane (MTES), 3-chloropropyltriethoxysilane (CPTES), dichlorodihexylsilane (DCHS), dichloro(methyl)octadecylsilane (DCMOS), dichlorododecylmethylsilane (DCDDMS), 3-glycidyloxypropyl(dimethoxy)-methylsilane (3-GOPDMMS), 3-glycidyloxypropyl-trimethoxysilane (3-GOPTMS), vinyltris(2-methoxyethoxy)silane (VT2MES), 3-(2-aminoethylamino)propyldimethoxymethylsilane (32AAPDMMA), 2,2,4,4,6,6-hexamethylcyclotrisilazane, 1H, 1H, 2H, 2H-perfluorooctyltriethoxysilane, and a combination thereof The phosphorus compound useful in the present invention may be selected from the group consisting of mono-n-didecyl phosphate, tributyl phosphate, 11-phosphonoundecanoic acid, hexadecylphosphonic acid, octylphosphonic acid, tetradecylphophonic acid, phosphate monoester of C8~18, phosphate diester of C8~18, and a combination thereof.

In one embodiment of the present invention, the coating composition for preventing the collapse of a capacitor may comprise a capacitor coating material in an amount of 1 to 50% by weight; and an organic solvent in an amount of 50 to 99% by weight.

When the content of the capacitor coating material is below 1% by weight, the capacitor may be insufficiently coated, which causes the collapse of the capacitor patterns. On the other hand, when used in an amount over 50% by weight, the capacitor coating material may remain between capacitor patterns or may clog the internal cylinder even after washing, thus interrupting the function of the capacitor.

No forces are applied to the capacitor patterns when the coating composition forms a contact angle of 90° with regard to water on the titanium nitride capacitor. This is, however, only a theory that is applicable to a flat plate of titanium nitride in a dry state after the coating is completed. In a practical washing process where different liquids are fed, a capacitor coating material that forms a contact angle of 80~140° on a flat plate is found to prevent the collapse of capacitor patterns as demonstrated experimentally.

This contact angle difference between a flat plate and a patterned substrate is believed to be attributed to the degree of coating on capacitor patterns, the time of treatment, and miscibility with water after treatment.

Hence, a capacity coating composition that forms a contact angle of 80~140° with regard to water on a capacitor made of titanium nitride (TiN) meets one of the requirements for use in the present invention.

Given a contact angle less than 80° or greater than 140°, the cos θ value is enlarged, which increases the force to a degree sufficient to collapse the pattern.

The capacitor coating material is contained in an amount of 1 to 50% by weight, based on 100% by weight of the coating composition for preventing the collapse of a capacitor. When the content of the capacitor coating material is less than 1% by weight, the capacitor coating material cannot cover all the capacitor patterns or the coating composition is used excessively. On the other hand, when used in an amount greater than 50% by weight, too much the capacitor coating material remains after washing, causing the collapse of the patterns, or the remainder is difficult to remove in a dry manner.

The content of the solvent depends on the content of the capacitor coating material. Some solvent is directly implicated in the coating, influencing a contact angle between the capacitor and water. The content of the solvent may range from 50 to 99% by weight, based on 100% by weight of the coating composition. The coating composition for preventing the collapse of a capacitor in accordance with the present invention is not readily applicable to the capacitor when the content of the solvent is below 50% by weight, and is used excessively if the content is over 99% by weight.

As described above, the solvent available for the present invention is an organic solvent selected from among glycol, alkylene glycol ether of C4~20, alkylene glycol alkyl ether of C4~C20, an alcohol of C1~C10, and a hydrocarbon of C6~C10.

Examples of the solvent useful in the present invention include tri(propyleneglycol)methylether, tri(propyleneglycol)monomethylether, diethyleneglycol monobutylether, diethyleneglycol monoisobutylether, diethyleneglycol dibutylether, ethyleneglycol, ethyleneglycol acetate, ethyleneglycol monobutylether, ethyleneglycol monoethylether, ethyleneglycol monomethylether, diethyleneglycol butylether, tripropyleneglycol, propyleneglycol, petroleum ether, mineral spirits, ethyl-3-ethoxypropionate, ethyl-2-hydroxypropanoate, 3-methoxybutylacetate, ethyl lactate, cyclohexanone, gamma-butyrolactone, methyl cellosolve acetate, butyl cellosolve, cyclopentanone, cyclohexanone, 2-ethoxyethanol acetate, isopropylalcohol, decane, methanol, ethanol, butanol, benzylalcohol, mesitylene, and glycol.

When coated with the coating composition, the capacitor has a contact angle of 80~140° with regard to water thereon so that its patterns can be prevented from collapsing in a washing process.

MODE FOR INVENTION

A better understanding of the present invention may be obtained through the following examples that are set forth to illustrate, but are not to be construed as limiting the present invention.

Example 1

To a 2000-mL flask were placed 100 ml of octadecyltrimethoxy silane and 900 ml of isopropyl alcohol, followed by mechanically stirring for 5 hrs. This solution was filtered three times through filters with pore sizes of 0.1 μm, 0.05 μm, and 0.02 μm, sequentially, to afford a coating composition for preventing the collapse of a capacitor.

A TiN substrate was coated with the coating composition, and measured for contact angle with regard to water.

An examination was made to see whether or not capacitor patterns collapsed when a wafer with the capacitor patterns was subjected to a spin-type washing process in the following manner.

The semiconductor substrate on which an oxide film and storage electrodes were formed was etched with an etchant such as fluoric acid to remove the capacitor oxide film. Then, the etchant was washed with water and alcohol. Subsequently, the substrate was coated with the coating composition, and cleansed with water, followed by a spin drying process. The resulting substrate was found to retain capacitors completely free of oxide films, without the collapse of the capacitors, as observed by SEM (Hitachi S-4200 series).

In this regard, the substrate had an array of capacitors, each 80 nm in width and 1,300 nm in height, thereon.

Example 2

To a 2000-mL flask were placed 100 ml of vinyltrimethoxy silane and 900 ml of tri(propyleneglycol)methylether, followed by mechanically stirring for 5 hrs. This solution was filtered three times through filters with pore sizes of 0.1 μm, 0.05 μm, and 0.02 μm, sequentially, to afford a coating composition for preventing the collapse of a capacitor. A TiN substrate was coated with the coating composition, and measured for contact angle with regard to water. The contact angle was measured by treating a wafer having capacitor patterns thereon in the same manner as in Example 1.

Example 3

To a 2000-mL flask were placed 100 ml of hexadecylphosphonoic acid, 100 ml of water, and 800 ml of diethyleneglycolmonobutylether, followed by mechanically stirring for 5 hrs. This solution was filtered three times through filters with pore sizes of 0.1 μm, 0.05 μm, and 0.02 μm, sequentially, to afford a coating composition for preventing the collapse of a capacitor. A TiN substrate was coated with the coating composition, and measured for contact angle with regard to water. The contact angle was measured by treating a wafer having capacitor patterns thereon in the same manner as in Example 1.

Example 4

To a 2000-mL flask were placed 100 ml of lauryl phosphate, 100 ml of water, and 800 ml of decane, followed by mechanically stirring for 5 hrs. This solution was filtered three times through filters with pore sizes of 0.1 μm, 0.05 μm, and 0.02 μm, sequentially, to afford a coating composition for preventing the collapse of a capacitor. A TiN substrate was coated with the coating composition, and measured for contact angle with regard to water. The contact angle was measured by treating a wafer having capacitor patterns thereon in the same manner as in Example 1.

Example 5

To a 2000-mL flask were placed 10 ml of octadecyltrimethoxy silane, 150 ml of hexadecylphosphonoic acid, 100 ml of water, and 840 ml of diethyleneglycolmonobutylether, followed by mechanically stirring for 5 hrs. This solution was filtered three times through filters with pore sizes of 0.1 μm, 0.05 μm, and 0.02 μm, sequentially, to afford a coating composition for preventing the collapse of a capacitor. A TiN substrate was coated with the coating composition, and measured for contact angle with regard to water. The contact angle was measured by treating a wafer having capacitor patterns thereon in the same manner as in Example 1.

Comparative Example

A semiconductor substrate on which an oxide film and storage electrodes were formed was etched with an etchant such as fluoric acid to remove the capacitor oxide film. Then, the etchant was washed with water and alcohol. Subsequently, the substrate was cleansed with water, followed by a spin drying process. The resulting substrate was found to be completely free of oxide films, but with the capacitors collapsed, as observed by SEM (Hitachi S-4200 series).

Results of Examples 1~5 and the Comparative Example are summarized in the following Table.

TABLE 1

| | Contact Angle (θ) | Whether Collapsed (○) or Not (X) |
|---|---|---|
| Example 1 | 81° | ○ |
| Example 2 | 101° | ○ |
| Example 3 | 108° | ○ |
| Example 4 | 122° | ○ |
| Example 5 | 105° | ○ |
| Comparative Example 1 | 20° | X |

INDUSTRIAL APPLICABILITY

The coating composition for preventing the collapse of capacitors in accordance with the present invention finds applications in semiconductor capacitors.

The invention claimed is:
1. A coating composition for preventing the collapse of a capacitor,
the coating composition comprising
a capacitor coating material in an amount of 1 to 50% by weight, and
an organic solvent in an amount of 50 to 99% by weight,
wherein the capacitor coating material contains (i) a phosphorus compound selected from the group consisting of hexadecylphosphonic acid, lauryl phosphate, and a combination thereof, or (ii) a phosphorus compound selected from the group consisting of hexadecylphosphonic acid, lauryl phosphate, and a combination thereof and a silane compound of the following Chemical Formula 1:

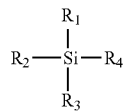

Chemical Formula 1 wherein $R_1$, $R_2$, $R_3$, and $R_4$ are each independently a hydrophilic group identified as an alkoxy group of C1-C4, or a hydrophobic group identified as an aromatic alkyl group of C2-C18, with a proviso that at least one of $R_1$, $R_2$, $R_3$, and $R_4$ is an alkoxy of C1-C4, and that at least one of $R_1$, $R_2$, $R_3$, and $R_4$ is an aromatic alkyl group of C7-C18;

wherein the organic solvent is selected from the group consisting of a glycol, alkylene glycol ether of C4-C20, alkylene glycol alkyl ether of C4-C20, an alcohol of C1-C10, a hydrocarbon of C6-C10, and a combination thereof; and wherein a capacitor coated with the coating composition for preventing the collapse has a contact angle of 105-122° with regard to water.

2. A capacitor, coated with the coating composition of claim 1.

3. The capacitor of claim 2, having a contact angle of 105-122° with regard to water.

* * * * *